July 12, 1955 E. J. HENLEY 2,713,122
AUTOMATIC FREQUENCY CONTROL
Filed Dec. 8, 1951
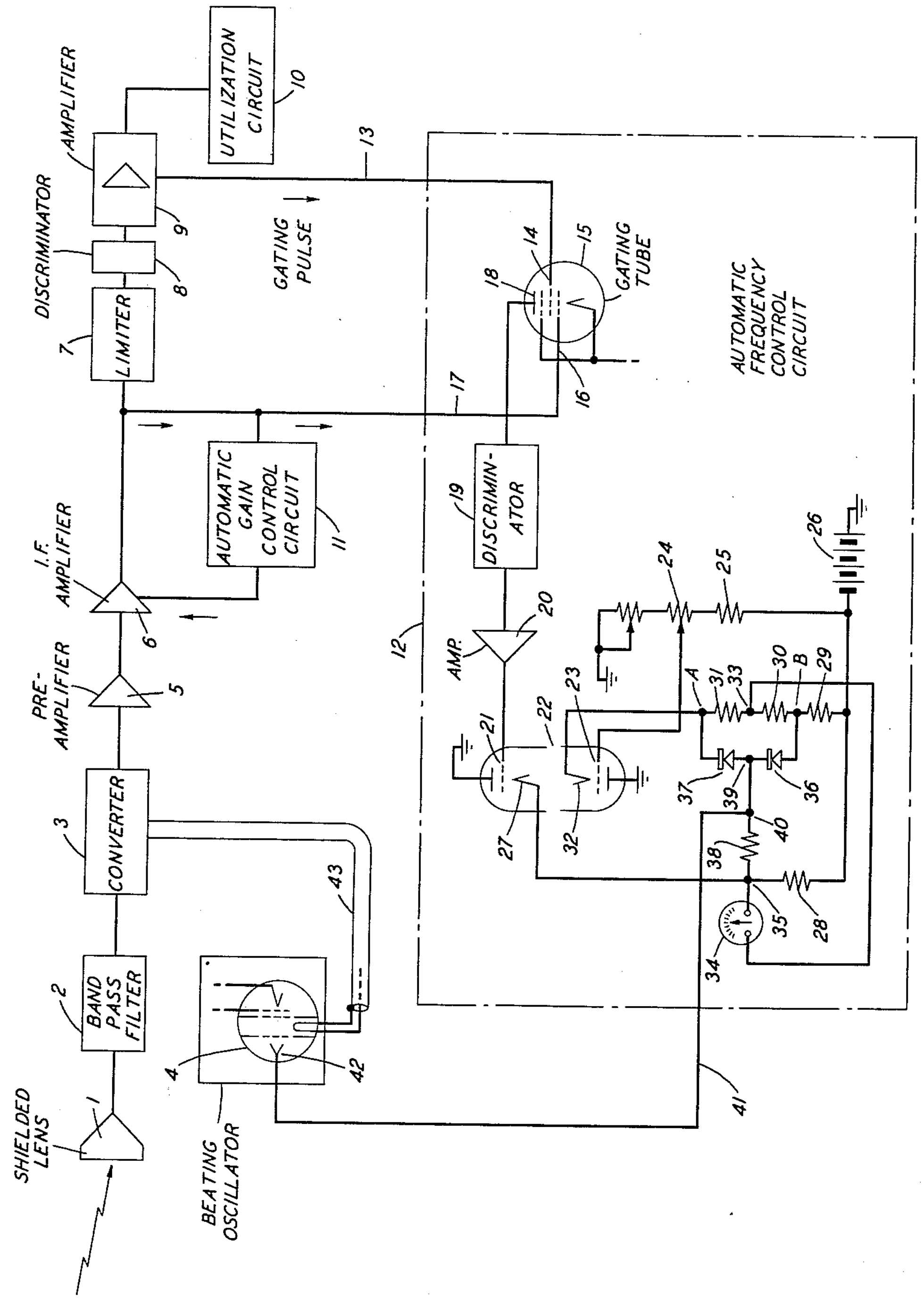
INVENTOR
E. J. HENLEY
BY B. J. Stoddard
ATTORNEY United States Patent Office 2,713,122
Patented July 12, 1955

2,713,122

AUTOMATIC FREQUENCY CONTROL

Edward Joseph Henley, Chicago, Ill., assignor to American Telephone and Telegraph Company, a corporation of New York Application December 8, 1951, Serial No. 260,652
2 Claims. (Cl. 250—36)

This invention relates to circuits for producing control potentials for automatically controlling or adjusting the frequency of electric wave energy generated by an oscillator and, more particularly, to means for limiting the range over which the frequency of the controlled oscillator is varied by the control potentials.

In radiant energy communication systems, it has been common practice to employ a beating oscillator in a receiving circuit in order to reduce the received high-frequency signal waves to intermediate frequencies. This is accomplished in a well-known manner by combining the received modulated carrier waves with the waves generated by the beating oscillator and obtaining the difference frequency. However, the mean frequency of the carrier waves may vary for various reasons, this being commonly called "frequency drift," and thereby change the difference frequency. Consequently, various types of automatic frequency control circuits have been employed to observe variations in the difference frequency and to feed back control potentials derived therefrom to the beating oscillator for adjusting its frequency of oscillation to correspond with the carrier drift so that the proper beat frequency difference may be maintained. Such control circuits function satisfactorily on most occasions, but it has been discovered that, under some circumstances, they cause the oscillator to operate at an undesired frequency. This is particularly objectionable because the automatic frequency control circuit tends to hold the beating oscillator at this undesired frequency thus preventing it from responding to the desired carrier frequency and thereby, in effect, locking-out the desired carrier. This undesirable lock-out effect may be produced by any one of several factors, such as noise currents present during the absence of carrier waves, spurious responses to undesired carrier energy, and cross-coupling in multi-channel systems.

Noise lock-out may occur during periods when no carrier energy is being received as noise currents in the first stages of a receiving system may then be amplified by the action of the conventional automatic gain control circuit to an extent sufficient to operate the automatic frequency control circuit. Since the noise frequencies may not be uniformly distributed, some may predominate to such an extent as to drive the beating oscillator to a frequency value beyond that which can subsequently be restored by the automatic frequency control circuit upon re-establishment of the carrier energy.

Lock-out due to spurious responses may be caused when undesired carrier energy produces harmonics in the converter having frequencies near the intermediate frequency of the receiving system. For example, let it be assumed that the desired carrier frequency is 4000 megacycles and that the beating oscillator is normally operating at 4065 megacycles to produce an intermediate frequency of 65 megacycles. Then, if undesired carrier energy having a frequency of 4032.5 megacycles is received, the difference frequency will be 32.5 megacycles and its second harmonic will have a frequency of 65 megacycles which is the same as the assigned intermediate frequency value. This condition can occur when the desired carrier is interrupted, such as by a power failure at the transmitting station. When the transmitting Klystron oscillator is started again in response to reapplication of power, it may first operate at a frequency of 4050 megacycles since it is characteristic of Klystron oscillators to start at a frequency higher than normal and then drift downward to the correct frequency. In so doing, it will drop to the frequency of 4032.5 megacycles and this will cause the automatic frequency control circuit at the receiver to lock the beating oscillator onto this frequency. As the frequency of the transmitting Klystron oscillator drifts downward, the automatic frequency control circuit carries the beating oscillator frequency downward correspondingly with the result that, by the time the carrier has reached its assigned frequency of 4000 megacycles, the beating oscillator frequency will be aproximately 32.5 megacycles below what it should be. Although the carrier will still be received under these circumstances, the quality of reception will be impaired because the strength of the signal will be about 45 decibels lower than normal thereby reducing the ability of the receiving system to suppress noise currents.

Cross-coupling in multi-channel systems may produce a lock-out condition in much the same manner as a spurious response. Assuming a system in which the carrier in one channel has a normal frequency of 4040 megacycles and the carrier in an adjoining channel has a normal assigned frequency of 4000 megacycles, then, in order to produce an intermediate frequency in each channel having a mean value of 65 megacycles, the beating oscillator in the first receiving channel should operate at 3975 megacycles and that in the other channel at 3935 megacycles. If a power interruption occurs at the transmitting station, then, when the transmitting Klystron oscillators are started again, each will operate initially at a considerably higher frequency than its normal assigned frequency, such as 50 megacycles higher. As their frequencies drift downward, the frequency of the Klystron oscillator in the second transmitting channel will drop from 4050 megacycles to 4040 megacycles which, when combined in the converter of the first receiving system with the frequency of 3975 megacycles from its associated beating oscillator, will produce an intermediate frequency of 65 megacycles. Since this is the assigned intermediate frequency, the automatic frequency control circuit in the first receiving system will seize upon this carrier energy and will drive the frequency of its associated beating oscillator downward as the carrier in the second channel continues to drift down to its assigned frequency of 4000 megacycles, at which point the beating oscillator in the first receiving system will have been forced down to operation at 3935 megacycles. At this time, the first carrier will have reached its assigned frequency of 4040 megacycles with the result that, when it is combined in the converter of the first receiving system with energy of 3935 megacycles from the associated beating oscillator, intermediate frequency energy of 105 megacycles will be produced. Since the succeeding stages in the first receiving system are not tuned to admit intermediate frequency energy of this value, the first carrier is thus effectively locked-out of its assigned receiving system.

Accordingly, it is an object of this invention to provide a radiant energy receiving system with means for avoiding lock-out of its assigned carrier waves.

An additional object is to provide a radiant energy receiving system with means for preventing excessive automatic frequency control action.

Another object is to impose upper and lower limits on control potentials produced by an automatic frequency control circuit.

Still another object is to limit the range over which the frequency of a controlled oscillator is varied by its associated control circuit.

These and other objects of the invention are accomplished in a radiant energy receiving system having an automatic frequency control circuit by coupling a potential divider to a stable source of electric energy and by connecting a pair of asymmetric conductors, such as germanium crystals, in series across the potential divider. Control potentials derived from the automatic frequency control circuit are applied to the mid-point between the asymmetric conductors, this mid-point being coupled to the control electrode of the controlled oscillator. During operation of the system, the control potentials will vary thereby causing one or the other of the asymmetric conductors to be rendered conductive to permit potentials to be applied to the control electrode of the controlled oscillator. Since the potential divider is coupled to a stable source of electric energy, the voltage drop across it will be of fixed magnitude with the result that the magnitude of the potentials applied to the control electrode of the controlled oscillator can in no instance exceed this value. This restriction of the magnitude of the control potentials in turn effectively limits the range over which the frequency of the controlled oscillator can be varied. These and other features of the invention are more fully discussed in connection with the following detailed description of the drawing which is a schematic circuit diagram of a radiant energy receiving system embodying the present invention.

The radiant energy receiving system shown in the drawing is, except for the improved automatic frequency control circuit, essentially the same as the receiving system disclosed in an article entitled "A new microwave television system" written by J. F. Wentz and K. D. Smith and published on pages 465 to 470, inclusive, in the "Transactions of the American Institute of Electrical Engineers," volume 66, 1947, and shown particularly in Fig. 6 on page 467 thereof. The disclosure of this article is incorporated herein by reference as a part of this specification. It is to be understood, however, that the receiving system of this invention is not restricted to the reception of television signals but may be employed for receiving other types of signals, such as multiplex telephone signals.

In the drawing, frequency-modulated super-high frequency carrier waves in the microwave range of the frequency spectrum are received by an antenna 1 of any suitable design, such as a shielded lens antenna, and are transmitted through a bandpass filter 2 to a converter 3. One radiant energy communication system embodying the present invention utilized a microwave carrier having an assigned normal operating frequency of 4000 megacycles. At the transmitting station, the frequency of this carrier was modulated with signals to produce a frequency-deviation band of 4 megacycles so that the frequency of the signal-modulated carrier waves varied from 3998 megacycles to 4002 megacycles. In order to reduce these microwave frequencies to intermediate frequencies centering around 65 megacycles, the incoming carrier waves are combined in the converter 3 with electric wave energy produced by a microwave beating oscillator 4 which is a reflex Klystron oscillator of any suitable design, such as that disclosed in Patent 2,411,913 issued December 3, 1946, to J. R. Pierce and W. G. Shepherd. The super-high frequency waves generated by the microwave beating oscillator 4 may have a frequency of either 4065 megacycles or 3935 megacycles. In either case, the output of the converter 3 consists of only the difference frequency centering around 65 megacycles.

These intermediate frequency waves are applied to a preamplifier 5 and an intermediate frequency amplifier 6. The resulting amplified waves are then passed through a limiter 7 to a discriminator 8. The output energy from the discriminator 8 is amplified in an amplifier 9, which in the case of a television system is a video amplifier, and is then delivered to a utilization circuit 10. As is indicated in the drawing, a portion of the output energy from the intermediate frequency amplifier 6 is supplied to both an automatic gain control circuit 11 and an automatic frequency control circuit 12. The automatic gain control circuit 11 produces a bias voltage which is inversely proportional to the average amplitude of the intermediate frequency waves. This bias voltage is fed back to the screen grid of the amplifier 6 for controlling its gain. The automatic frequency control circuit 12 provides a control potential which is applied to the repeller electrode of the Klystron oscillator 4 for adjusting its frequency of oscillation.

Due to the nature of an automatic frequency control circuit, it must operate with respect to a point in the applied signaling energy which has a fixed frequency value regardless of signal content. In the case of a television receiving system, this is conveniently provided by the line synchronizing pulses. Accordingly, the video amplifier 9 is designed to generate a gating pulse during a short portion of a line synchronizing pulse. This gating pulse is transmitted over a conductor 13 to the screen grid 14 of a gating tube 15 in the automatic frequency control circuit 12. During an absence of voltage on its screen grid 14, the tube 15 is normally not operative. As is shown in the drawing, the control grid 16 of the gating tube 15 is coupled by a conductor 17 to the output of the intermediate frequency amplifier 6, and the anode 18 of the tube 15 is connected to a discriminator network 19. Thus, when a gating pulse is delivered to the tube 15, its anode 18 supplies the discriminator 19 with a burst of the intermediate frequency signaling energy.

The output energy from the discriminator 19 is amplified by a direct-current amplifier 20 and is then applied to a control grid 21 of a double cathode-follower tube 22. The other control grid 23 of the tube 22 is coupled through a potentiometer 24 and a resistor 25 to a stable source 26 of negative potential. In one embodiment of the invention, the source 26 was constituted by a regulated rectifier supplying −380 volts. The cathode 27, which is associated with the grid 21, is coupled through a resistor 28 to the regulated source 26. The source 26 is also coupled by a resistor 29 and a potential divider, constituted by two equal resistors 30 and 31, to the cathode 32 which is associated with the grid 23. In one embodiment of the invention, the value of the resistors 30 and 31 was selected to be such as to produce a potential difference of 6 volts between their terminals A and B. Since the potential from the source 26 is stable, the potential difference between the terminals A and B will likewise be stable. The mid-point 33 between the resistors 30 and 31 constituting the potential divider is connected to one terminal of a meter 34 which has its other terminal connected to the junction point 35 between the cathode 27 and its resistor 28.

A pair of asymmetric conductors 36 and 37, such as germanium crystals, are connected in series across the potential divider constituted by the resistors 30 and 31. Control potentials derived from the grid 21-cathode 27 circuit are applied through a resistor 38 to the mid-point 39 between the crystal rectifiers 36 and 37. The junction point 40 between the resistor 38 and the mid-point 39 is coupled by a conductor 41 to the repeller electrode 42 of the Klystron oscillator 4. As is indicated in the drawing, the output microwave energy generated by the Klystron oscillator 4 is transmitted over a coaxial line 43 to the converter 3. Initially, the various circuit elements are so adjusted that the potential at the junction point 35 is equal to the potential a the mid-point 33 beween the resistors 30 and 31 constituting the potential divider. The existence of this condition is indicated by a zero reading on the meter 34. Under this condition, neither of the asymmetric conductors 30 and 31 will be conductive.

During operation of the system, the mean frequency of the received carrier waves may vary or drift from the assigned frequency value for various reasons, as was mentioned above. In accordance with this change, the discriminator 19 will produce a direct current output which will cause the potential on the grid 21 of the tube 22 to become either less negative or more negative depending on whether the instant mean carrier frequency is above or below its assigned frequency. When the potential on the grid 21 is made less negative, the potential drop across the resistor 28 will be caused to become correspondingly greater with the result that the potential at the junction point 35 becomes less negative. Since under the initial line-up conditions, the potential at the junction point 35 was made equal to the potential at the mid-point 33, the change now made in the potential at the junction point 35 will cause it to become more positive with respect to the mid-point 33.

If the potential change is large enough, the junction point 35 will also become positive with respect to the terminal A thereby rendering the asymmetric conductor 37 conductive. As the conductive resistance of the asymmetric conductor 37 is very small in comparison with that of the resistor 38, the potential at the mid-point 39 assumes a value approximately equal to the potential on the terminal A. Since the potential at the junction point 40 is the same as that at the mid-point 39, the present potential at the terminal A will be applied over the conductor 41 to the repeller electrode 42 of the Klystron oscillator 4 and will change the frequency of its generated wave energy accordingly. As was stated above, the potential from the source 26 is stable. Therefore, even though the potential at the junction point 35 may become increasingly less negative, the potential at the mid-point 39 and the junction point 40 can not become more positive than the potential at the terminal A.

During operation of the system, the mean frequency of the received carrier may vary in such a direction as to cause the output from the discriminator 19 to render the potential on the grid 21 more negative. In this event, the potential drop across the resistor 28 will become smaller with the result that the potential at the junction point 35 becomes negative with respect to the poential at the mid-point 33. If the potential change due to this direction of frequency deviation of the carrier becomes sufficiently large, the point 35 will become negative with respect to the terminal B thus causing the asymmetric conductor 36 to become conductive. Since the conductive resistance of the asymmetric conductor 36 is very small in comparison with the resistor 38, the potential at the points 39 and 40 will now become equal to the potential at the terminal B and this potential will now be applied over the conductor 41 to the repeller electrode 42 of the Klystron oscillator 4. Due to the potential from the source 26 being stable, the potential at the points 39 and 40 cannot become more negative than the potential on the terminal B.

From this it can be understood that, since the potential difference between the terminals A and B is stable, the automatic frequency control potentials applied to the repeller electrode 42 cannot exceed the upper and lower limits determined by the potentials on the terminals A and B. With the automatic frequency control potentials thus limited to this stable potential difference between the terminals A and B, corresponding limits are imposed upon the range over which the frequency of the controlled Klystron oscillator 4 can be varied. This insures that lock-out of the desired carrier energy will be avoided in a radiant energy receiving system employing restricted automatic frequency control means of the type described.

It is to be understood that this invention has been described above with reference to a specific automatic frequency control circuit for the purpose of explaining its principles and features of operation and that the invention is not to be restricted to this particular embodiment but is to be limited only by the claims appended hereto.

What is claimed is:

1. In combination, a reflex Klystron oscillator for generating super-high frequency electric waves in the microwave range of the frequency spectrum, said reflex Klystron oscillator having a repeller electrode for determining its frequency of oscillation, an automatic frequency control circuit for automatically controlling the frequency of the super-high frequency electric waves generated by said reflex Klystron oscillator, said circuit comprising discriminator means for producing varying control voltages, a double cathode-follower tube having two anodes and first and second grid-cathode circuits, means for connecting each of said anodes to ground, said first grid-cathode circuit having a first control grid and a first cathode, means for applying said varying control voltages to said first control grid, said second grid-cathode circuit having a second control grid and a second cathode, a source of constant potential, means for coupling said source to said second control grid, a potential divider, an electric path connected in parallel across said potential divider, a pair of asymmetric conductors connected in series in said path and having a mid-point therebetween, a first resistor, a second resistor, means for coupling one end of said potential divider to said second cathode, means for coupling the other end of said potential divider to said source and also to one end of said first resistor, means for coupling the other end of said first resistor to said first cathode and also to one end of said second resistor, means for directly connecting the other end of said second resistor to said mid-point between said asymmetric conductors, a direct-current circuit extending from said other end of said second resistor to said repeller electrode of said reflex Klystron oscillator, said potential divider having a mid-point thereon, and a direct-current circuit extending from said mid-point on said potential divider to said ends of said first and second resistors that are coupled together.

2. In combination, a reflex Klystron oscillator for generating super-high frequency electric waves in the microwave range of the frequency spectrum, said reflex Klystron oscillator having a repeller electrode for determining its frequency of oscillation, an automatic frequency control circuit for automatically controlling the frequency of the super-high frequency electric waves generated by said reflex Klystron oscillator, said circuit comprising discriminator means for producing varying control voltages, a double cathode-follower tube having two anodes and first and second grid-cathode circuits, means for connecting each of said anodes to ground, said first grid-cathode circuit having a first control grid and a first cathode, means for applying said varying control voltages to said first control grid, a first direct-current circuit extending from said first cathode to said repeller electrode, said second grid-cathode circuit having a second control grid and a second cathode, a source of constant potential, means for coupling said source to said second control grid, a second direct-current circuit extending from said source to said first cathode, a potential divider constituted by two equal resistors having a mid-point therebetween, a third direct-current circuit extending from said mid-point to said first cathode, means for coupling one end of said potential divider to said source, means for coupling the other end of said potential divider to said second cathode, an electric path connected in parallel across said potential divider, a pair of asymmetric conductors connected in series in said path and having a midpoint therebetween, a fourth direct-current circuit extending from the mid-point between said asymmetric conductors to said first cathode, and a fifth direct-current circuit extending from the mid-point between said asymmetric conductors to said repeller electrode of said reflex Klystron oscillator.

References Cited in the file of this patent

UNITED STATES PATENTS

| | | |
|---|---|---|
| 2,129,085 | Foster | Sept. 6, 1938 |
| 2,502,456 | Hansen et al. | Apr. 4, 1950 |
| 2,583,023 | Spangenberg | Jan. 22, 1952 |
| 2,594,263 | Munster | Apr. 22, 1952 |

FOREIGN PATENTS

| | | |
|---|---|---|
| 57,613 | Denmark | May 20, 1940 |